United States Patent
Pogash et al.

(10) Patent No.: US 9,793,692 B1
(45) Date of Patent: Oct. 17, 2017

(54) GROUNDED CABLE ASSEMBLY OF A COMMUNICATION SYSTEM

(71) Applicant: TYCO ELECTRONICS CORPORATION, Berwyn, PA (US)

(72) Inventors: Christopher Michael Pogash, Harrisburg, PA (US); Tracy Lee Smith, Harrisburg, PA (US); Glen Gutgold, Harrisburg, PA (US)

(73) Assignee: TE CONNECTIVITY CORPORATION, Berwyn, PA (US)

( * ) Notice: Subject to any disclaimer, the term of this patent is extended or adjusted under 35 U.S.C. 154(b) by 0 days.

(21) Appl. No.: 15/251,460

(22) Filed: Aug. 30, 2016

(51) Int. Cl.
| | |
|---|---|
| H02G 3/04 | (2006.01) |
| H05K 5/02 | (2006.01) |
| H01B 11/18 | (2006.01) |
| H01B 17/58 | (2006.01) |
| H01B 7/02 | (2006.01) |

(52) U.S. Cl.
CPC ......... *H02G 3/0406* (2013.01); *H01B 7/0216* (2013.01); *H01B 11/1895* (2013.01); *H01B 17/583* (2013.01); *H05K 5/0247* (2013.01)

(58) Field of Classification Search
CPC .... H01B 17/583; H05K 5/069; H05K 9/0015; H05K 9/0098; H02G 3/04; H02G 15/13
USPC .......... 174/360, 358, 659, 382, 668
See application file for complete search history.

(56) References Cited

U.S. PATENT DOCUMENTS

| | | | | |
|---|---|---|---|---|
| 6,793,532 B2* | 9/2004 | Saito | ............. | H01R 9/0518 174/360 |
| 8,791,373 B1* | 7/2014 | Hull | ............. | H01R 13/658 174/359 |
| 2006/0276080 A1* | 12/2006 | Kameyama | ........ | H01R 13/5205 439/587 |
| 2012/0190238 A1* | 7/2012 | Omae | ............. | H01R 13/6592 439/620.01 |
| 2016/0043507 A1 | 2/2016 | Rossman et al. | | |

FOREIGN PATENT DOCUMENTS

WO      2015007745 A1    1/2015

* cited by examiner

*Primary Examiner* — Hoa C Nguyen
*Assistant Examiner* — Amol Patel

(57) ABSTRACT

A cable assembly includes a grommet, a cable, and a ferrule. The grommet has a cylindrical sleeve defining a cable channel therethrough and a flange extending radially outward from the cylindrical sleeve. The cable includes one or more insulated wires, a cable shield surrounding the one or more insulated wires, and an outer jacket surrounding the cable shield. The cable extends through the cable channel of the grommet. The cable shield and the one or more insulated wires protrude from an end of the outer jacket. The cable shield has an overlap portion extending around the end of the outer jacket and surrounding and engaging the cylindrical sleeve of the grommet to electrically connect the cable shield to the grommet. The ferrule surrounds and engages the overlap portion of the cable shield to secure the overlap portion to the cylindrical sleeve of the grommet.

20 Claims, 5 Drawing Sheets

GROUNDED CABLE ASSEMBLY OF A COMMUNICATION SYSTEM

BACKGROUND OF THE INVENTION

The subject matter herein relates generally to cable assemblies for interconnecting communication devices in a communication system and for providing a grounding path between the cable assemblies and the communication devices.

Communication systems include various devices, such as routers, servers, switches, redundant arrays of inexpensive disks (RAIDs), uninterruptible power supplies (UPSs), host bus adapters (HBAs), supercomputers, and the like, may be large complex systems that have a number of components interconnected to one another through different types of cable assemblies. For example, cable backplane (or cable midplane) systems include several daughter card assemblies that are interconnected to one another through cable assemblies. The daughter card assemblies of such systems may also be interconnected with remote components or devices through different types of cable assemblies.

Cable assemblies include electrical cables having multiple conductors, such as insulated wires, that interconnect two or more communication devices. The electrical cable also includes a shielding layer that surrounds the conductors and a protective jacket surrounding the shielding layer. The multiple conductors are terminated to a corresponding electrical contact of a cable connector or directly to an electronic component, such as a printed circuit board, of a communication device via soldering or the like.

The cable assemblies may be mounted to a housing of the communication device, such that the cable extends through a panel in the housing to enter an internal cavity of the housing that includes one or more electronic components therein. For some cable assemblies, the shielding layer of the cable is peeled back from the multiple conductors to engage and electrically connect the cable to an electrically conductive panel of the housing in order to provide a ground path between the cable and the housing. But, the remaining lengths of the conductors within the internal cavity (for example, between the panel and ends of the conductors) are not shielded by the shielding layer, resulting in signal degradation due to increased cross-talk between conductors and/or electromagnetic interference (EMI) from other electronic components within the housing. Furthermore, some cable assemblies are irremovably mounted to the housing of a communication device, such as via soldering or welding. Therefore, it is difficult to substitute one or more cable assemblies that have damaged cables, for example. In other cable assemblies, the shielding layer is not peeled back from the conductors to engage the panel to allow for shielding of the conductors within the housing, but the lack of a ground path from the cable to the housing may result in increased electrical resonance through the cable at certain frequencies.

Accordingly, there is a need for cable assemblies of a communication system that have an improved grounding and shielding of the multiple conductors at a communication device, and are also removably mounted to a housing of the communication device.

BRIEF DESCRIPTION OF THE INVENTION

In an embodiment, a cable assembly is provided that includes a grommet, a cable, and a ferrule. The grommet has a cylindrical sleeve defining a cable channel therethrough and a flange extending radially outward from the cylindrical sleeve. The cable includes one or more insulated wires, a cable shield surrounding the one or more insulated wires, and an outer jacket surrounding the cable shield. The cable extends through the cable channel of the grommet. The cable shield and the one or more insulated wires protrude from an end of the outer jacket. The cable shield has an overlap portion extending around the end of the outer jacket and surrounding and engaging the cylindrical sleeve of the grommet to electrically connect the cable shield to the grommet. The ferrule surrounds and engages the overlap portion of the cable shield to secure the overlap portion to the cylindrical sleeve of the grommet.

In another embodiment, a cable assembly is provided that includes a grommet, a cable, and a ferrule. The grommet has a cylindrical sleeve defining a cable channel therethrough between an interior end and an exterior end of the grommet. The cable includes one or more insulated wires, a cable shield surrounding the one or more insulated wires, and an outer jacket surrounding the cable shield. The cable extends through the cable channel of the grommet. The cable shield and the one or more insulated wires protrude from an end of the outer jacket. The cable shield has an overlap portion extending around the end of the outer jacket. The overlap portion extends over the interior end of the grommet and engaging an outer surface of the cylindrical sleeve to electrically connect the cable shield to the grommet. The cable shield further including an exposed segment extending from the overlap portion to an end of the cable shield. The exposed segment surrounds the one or more insulated wires of the cable beyond the end of the outer jacket and beyond the interior end of the grommet. The ferrule surrounds and engages the overlap portion of the cable shield to secure the overlap portion to the cylindrical sleeve of the grommet.

In a further embodiment, a communication system is provided that includes a communication device and a cable assembly. The communication device includes a device housing that has multiple panels defining an internal cavity. The panels include a cable panel defining a loading passage through the panel that is open to the internal cavity. The cable assembly is configured to be removably mounted within the loading passage of the panel. The cable assembly includes a grommet having a cylindrical sleeve defining a cable channel therethrough and a flange extending radially outward from the cylindrical sleeve. The flange defines a slot along an outer perimeter thereof that receives an edge of the panel at the loading passage to mount the cable assembly to the panel. The cable includes one or more insulated wires, a cable shield surrounding the one or more insulated wires, and an outer jacket surrounding the cable shield. The cable extends through the cable channel of the grommet into the internal cavity of the device housing. The cable shield and the one or more insulated wires protrude from an end of the outer jacket. The cable shield has an overlap portion extending around the end of the outer jacket and surrounding and engaging the cylindrical sleeve of the grommet to electrically connect the cable shield to the grommet.

DETAILED DESCRIPTION OF THE INVENTION

Embodiments set forth herein include communication systems that include cable assemblies that are mounted to device housings of communication devices to interconnect the communication devices. The cable assemblies are configured to provide an electrical ground path between a shielding layer of each cable and a panel of a corresponding device housing. The shielding layer of a corresponding cable may also extend beyond the panel into the device housing to provide electrical shielding of the insulated wires of the cable within the device housing. Optionally, the cable assemblies are removably mounted to the panel of the device housing to allow for substituting the cable assemblies and/or disassembly of the communication system. For example, the cable assemblies include a conductive grommet that is loaded around a perimeter of the cable, such that the grommet surrounds a protective outer jacket of the corresponding cable. The grommet includes a coupling feature that engages a complementary coupling feature of a panel of a device housing to removably mount the cable assembly to the panel. The coupling feature of the grommet may be a slot defined along a perimeter of the grommet or a ledge protruding from a perimeter of the grommet. The shielding layer of the cable may be electrically connected to the grommet that surrounds the cable by folding back an overlap portion of the shielding layer around an end of the outer jacket such that the overlap portion engages the grommet. The cable assembly may include a ferrule that surrounds and engages the overlap portion and/or the grommet to secure the connection between the overlap portion of the shielding layer and the grommet. Optionally, the shielding layer may be folded back onto itself to define an exposed portion that extends from the overlap portion beyond the end of the outer jacket and beyond the grommet. The exposed portion extends into the device housing to surround and electrically shield the insulated wires within the device housing.

Figure 1:
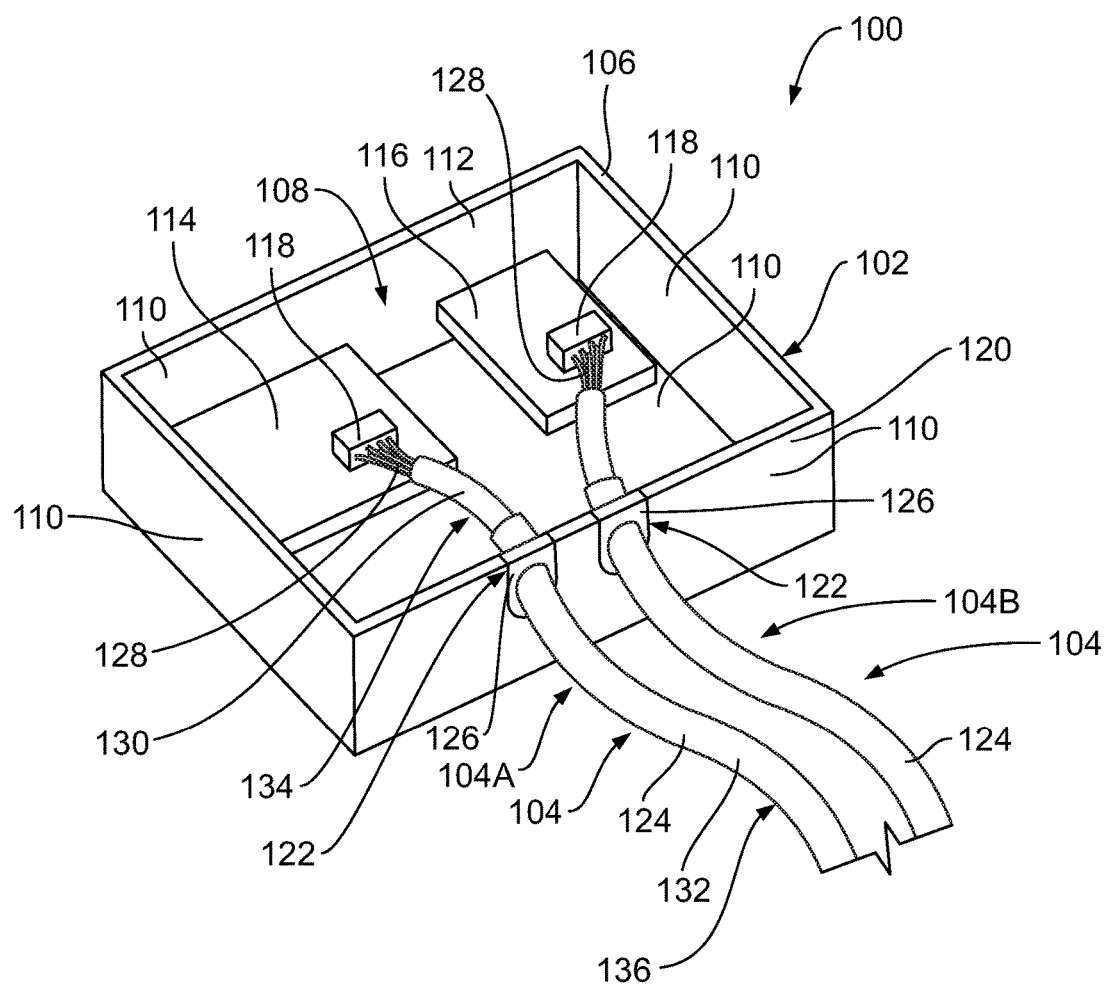
FIG. 1 is a top perspective view of a communication system in accordance with an embodiment.

FIG. 1 is a top perspective view of a communication system 100 in accordance with an embodiment. The communication system 100 shown in FIG. 1 is intended as a schematic representation of an example embodiment of the communication system 100. The communication system 100 includes a communication device 102 and two cable assemblies 104 coupled to the communication device 102. The cable assemblies 104 interconnect the communication device 102 to remote devices (not shown). The communication device 102 may be a router, a server, a computer, a host adapter, or the like. The communication device 102 includes a device housing 106 that defines an internal cavity 108 within panels or walls 110. Although the device housing 106 is shown in FIG. 1 as being open along a top, the housing 106 in an embodiment includes a top panel that is not shown. For example, the panels 110 of the device housing 106 may be discrete components that are assembled together to form the housing 106. Optionally, the device housing 106 includes multiple shells, such as an upper housing shell and a lower housing shell 112, and only the lower housing shell 112 is shown in FIG. 1. As used herein, relative or spatial terms such as "front," "back," "upper," "lower," "top," and "bottom" are used to distinguish the referenced elements and do not necessarily require particular positions or orientations in the communication system 100 or in the surrounding environment of the communication system 100.

The communication device 102 includes various electronic components within the internal cavity 108. In the illustrated embodiment, the communication device 102 includes a first circuit board 114 and a second circuit board 116, but the communication device 102 may include additional and/or different electronic components in other embodiments. A first cable assembly 104A of the two cable assemblies 104 is connected to the first circuit board 114, and a second cable assembly 104B is connected to the second circuit board 116. For example, each cable assembly 104 includes a respective cable connector 118 that removably connects to the corresponding circuit board 114, 116.

Each of the cable assemblies 104 includes a cable 124 and a grommet 126. The cable 124 includes multiple insulated wires 128 that are terminated to corresponding contacts (not shown) of the respective cable connector 118. The cable 124 also includes a cable shield 130 commonly surrounding the insulated wires 128, and an outer jacket 132 surrounding the cable shield 130. The grommet 126 is loaded onto the cable 124 around the outer jacket 132. The grommet 126 engages the device housing 106 to mount the cable assembly 104 to the device housing 106.

One of the panels 110 of the device housing 106 is a cable panel 120 through which the cable assemblies 104 extend. The cable panel 120 defines multiple loading passages 122 through the cable panel 120 that are each configured to receive one cable assembly 104. The loading passages 122 are open to the internal cavity 108. The cable assemblies 104 extend into the internal cavity 108 from outside of the device housing 106 through the corresponding loading passages 122. For example, the grommets 126 engage the edges of the cable panel 120 around the loading passages 122 to mount the cable assemblies 104 to the housing 106. An interior portion 134 of the cable 124 is located within the internal cavity 108 of the housing 106. An exterior portion 136 of the cable 124 is disposed outside of the housing 106 and extends to the remote communication device.

Figure 2:
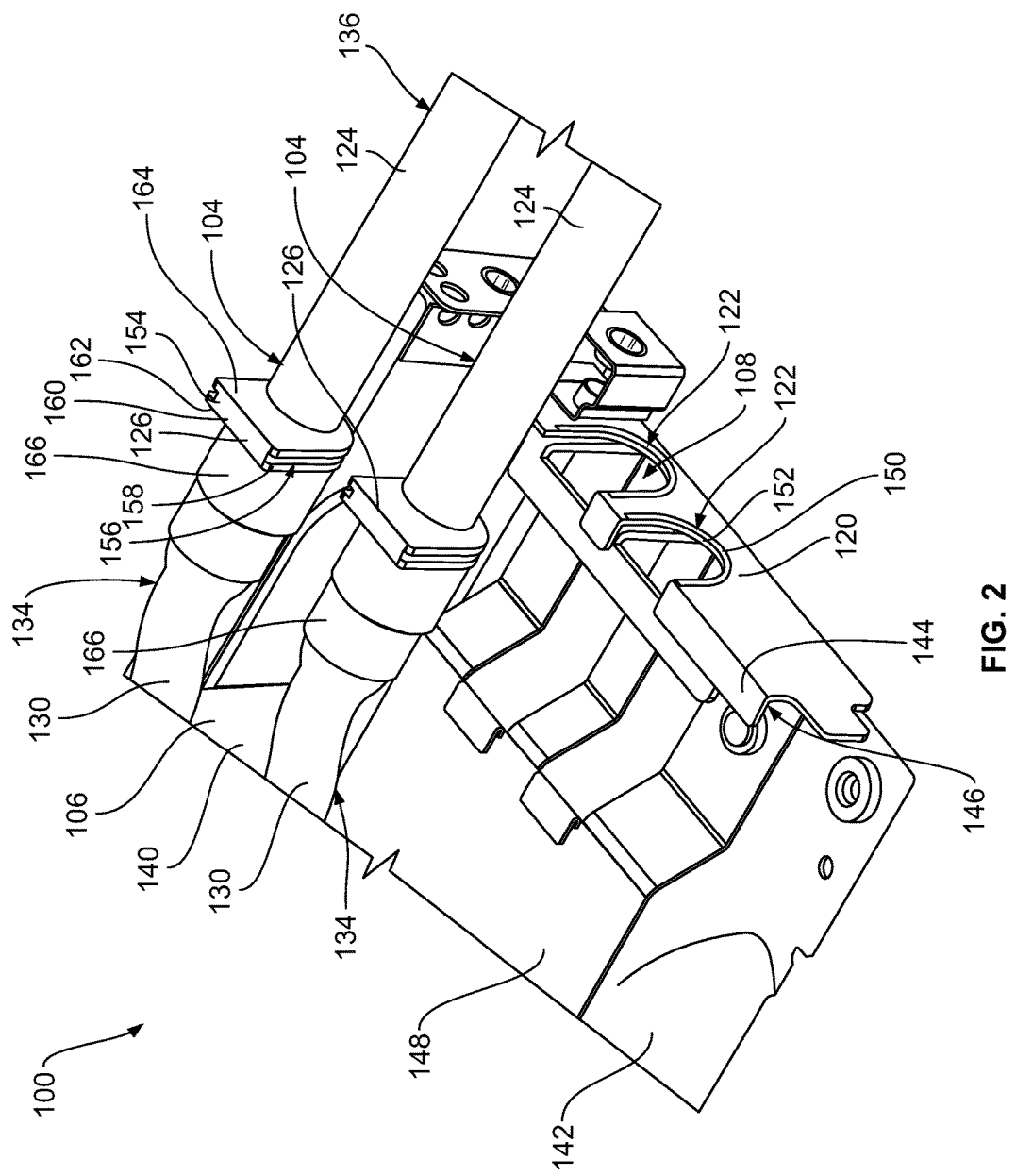
FIG. 2 is an exploded top perspective view of a portion of the communication system according to an embodiment.

FIG. 2 is an exploded top perspective view of a portion of the communication system 100 according to an embodiment. The two cable assemblies 104 are shown separated from the device housing 106. More particularly, the cable assemblies 104 are elevated above the device housing 106 and poised for loading into the corresponding loading passages 122 of the cable panel 120. The device housing 106 shown in FIG. 2 may be a portion of the housing 106 shown in FIG. 1. For example, the housing 106 in FIG. 2 illustrates the cable panel 120, a side panel 140, and a bottom panel 142. The cable panel 120 includes a shelf 144 at a top 146 of the panel 120. The shelf 144 may be used for coupling the cable panel 120 to a top panel of the housing 106. Optionally, the device housing 106 includes a hold-down plate 148 coupled to the bottom panel 142. The hold-down plate 148 is configured to engage the interior portions 134 of the cables 124 within the internal cavity 108 to separate the cables 124 from other electronic components in the housing 106. In an embodiment, the cable panel 120, and optionally the entire device housing 106, is composed of an electrically conductive material, such as one or more metals.

The loading passages 122 are open along the top 146 of the cable panel 120. The loading passages 122 include curved bottom ends 150, such that the loading passages 122 are U-shaped. The loading passages 122 may have other shapes in other embodiments, such as rectangular, or the like. The cable panel 120 includes inner edges 152 that extend downward from the top 146 of the panel 120 and define the perimeters of the loading passages 122.

The cable assemblies 104 are identical or at least similar in the illustrated embodiment, such that the following description applies to both cable assemblies 104. Each cable assembly 104 includes the grommet 126 and the cable 124 extending through the grommet 126. The grommet 126 includes a flange 154 that is configured to engage the cable panel 120 to mount the corresponding cable assembly 104 to the device housing 106. In the illustrated embodiment, the grommet 126 defines a slot 156 along an outer perimeter 158 of the grommet 126. The slot 156 may extend along a majority of the outer perimeter 158 of the grommet 126 except for a top surface 160 of the grommet 126. In an embodiment, the cable assemblies 104 are mounted to the housing 106 by lowering the cable assemblies 104 from above into the corresponding loading passages 122 such that the inner edges 152 of the cable panel 120 defining the loading passages 122 are received in the slots 156 of the grommets 126. Optionally, the grommets 126 may include a crush rib (not shown) or another interference feature within the slots 156 to increase the friction between the grommets 126 and the inner edges 152 of the cable panel 120 to secure the grommets 126 to the cable panel 120. The slots 156 of the flanges 154 are designed to allow the cable assemblies 104 to be removably mounted to the cable panel 120 within the loading passages 122. In an alternative embodiment, the inner edges 152 of the cable panel 120 define slots, and the grommets 126 include ledges or tabs extending radially outward from the grommets 126 to be received within the slot of the inner edges 152 during the mounting process.

The flange 154 of the grommet 126 has an inner side 162 and an opposite outer side 164. Since the flange 154 aligns with the cable panel 120, the inner side 162 faces the internal cavity 108 and the outer side 164 faces outside of the device housing 106. The interior portion 134 of the cable 124 extends beyond the inner side 162 of the flange 154, and the exterior portion 136 of the cable 124 extends from the outer side 164. In an embodiment, the cable assemblies 104 include ferrules 166 along the interior portions 134 of the cables 124. The ferrules 166 surround the cables 124 and portions of the grommets 126. The ferrules 166 are used to secure the cable shield 130 of the corresponding cable 124 to the grommet 126, as described in more detail below with reference to FIG. 6.

Figure 3:
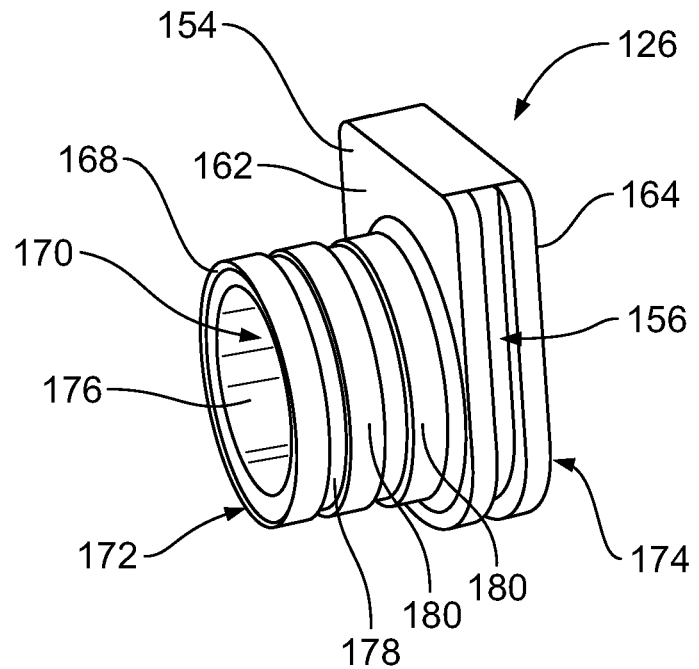
FIG. 3 is a perspective view of a grommet of a cable assembly of the communication system according to an embodiment.

FIG. 3 is a perspective view of a grommet 126 of a cable assembly 104 (shown in FIG. 2) of the communication system 100 (FIG. 1) according to an embodiment. The grommet 126 includes the flange 154 and a cylindrical sleeve 168. The cylindrical sleeve 168 defines a cable channel 170 therethrough that extends between an interior end 172 and an opposite exterior end 174 of the grommet 126. The flange 154 extends radially outward from the cylindrical sleeve 168. The flange 154 is disposed at, or at least proximate to, the exterior end 174, and the cylindrical sleeve 168 extends axially from the flange 154 to the interior end 172. For example, the cylindrical sleeve 168 extends from the inner side 162 of the flange 154 to the interior end 172, and the outer side 164 of the flange 154 defines the exterior end 174. An inner surface 176 of the cylindrical sleeve 168 defines the cable channel 170. The cable channel 170 is cylindrical in the illustrated embodiment to accommodate the generally circular cross-sectional shape of the cable 124. Optionally, an outer surface 178 of the cylindrical sleeve 168 may include one or more annular ridges 180 that extend circumferentially around the sleeve 168, which provides the outer surface 178 with a non-linear (for example, undulating or tortuous) profile in the axial direction. The annular ridges 180 may assist in binding the cable shield 130 (e.g., a conductive braid of the cable shield) during crimping of the ferrule 166 by providing additional contact points to ensure a reliable ground connection along the circumference of the sleeve 168 of the grommet 126. The annular ridges 180 also may resist axial tension on the cable shield 130 in the direction of the internal cavity 108. Alternatively, the outer surface 178 may have a generally linear profile in the axial direction.

The grommet 126 is composed of an electrically conductive material, such as one or more metals. Alternatively, the grommet 126 may be composed of a conductive polymer material or a lossy material that includes conductive metal or carbon particles dispersed in a non-conductive polymer. The grommet 126 may be formed via die-casting, injection molding, or the like. In an embodiment, the grommet 126 is a unitary, one-piece component such that the flange 154 is integral to the cylindrical sleeve 168.

Figure 4:
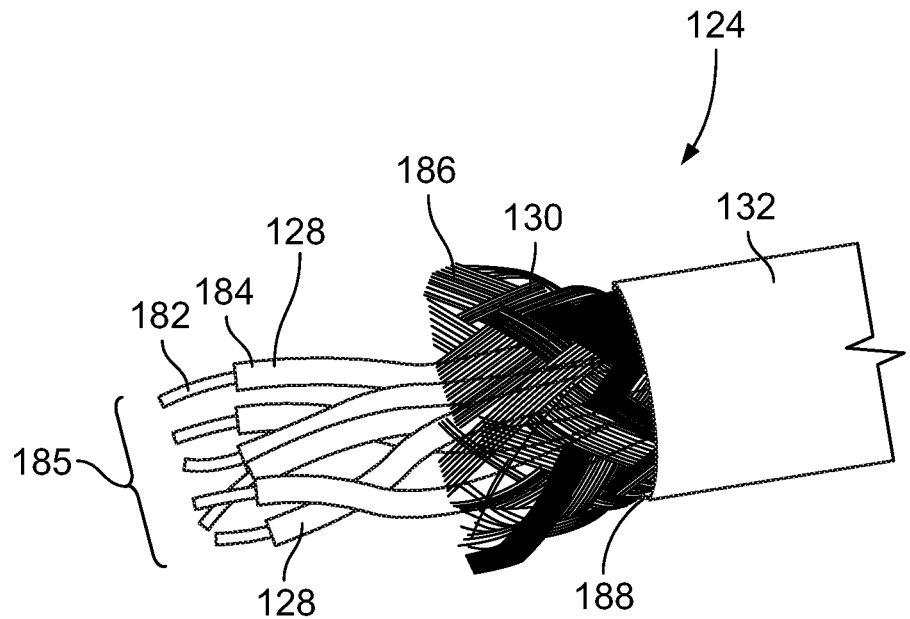
FIG. 4 is a perspective view of an end of a cable of the cable assembly according to an embodiment.

FIG. 4 is a perspective view of an end of the cable 124 of a cable assembly 104 according to an embodiment. The cable 124 includes a plurality of insulated wires 128, the cable shield 130 surrounding the insulated wires 128, and the outer jacket 132 surrounding the cable shield 130 (and the insulated wires 128 within the cable shield 130). In some embodiments, the insulated wires 128 may be sub-grouped within the cable shield 130 by sub jackets (not shown). For example, at least some of the wires 128 may be grouped into pairs for conveying differential signals. The cable 124 may include any number of insulated wires 128. Although six insulated wires 128 are shown in FIG. 4, the cable 124 may include more or less than six wires 128 in other embodiments. For example, in one embodiment the cable 124 may include only one insulated wire 128, such that the cable 124 is a coaxial cable. The insulated wires 128 may each include a conductive metal core 182 surrounded by an insulation layer 184. The insulation layer 184 is composed of an electrically insulative material, such as one or more plastics. The insulated wires 128 are commonly referred to herein as a wire bundle 185.

The cable shield 130 is configured to shield the wire bundle 185 from EMI from adjacent cable assemblies 104. In an embodiment, the cable shield 130 includes a conductive braid 186 composed of interwoven strands or fibers of metal. Optionally, the cable shield 130 may also include a conductive foil (not shown) composed of one or more metals. The conductive foil may be disposed radially between the conductive braid 186 and the wire bundle 185. In one or more embodiments, the cable shield 130 may include the conductive braid 186 alone, the conductive foil alone, or both the conductive braid 186 and the conductive foil.

The outer jacket 132 is composed of a dielectric material, such as one or more plastics. The outer jacket 132 is configured to protect the cable shield 130 and the wire bundle 185 within the outer jacket 132, such as against abrasions and dirt and other contaminants. In an embodiment, the wire bundle 185 and the cable shield 130 both protrude from an end 188 of the outer jacket 132 within the internal cavity 108 (shown in FIG. 1) of the device housing 106 (FIG. 1).

Figure 5:
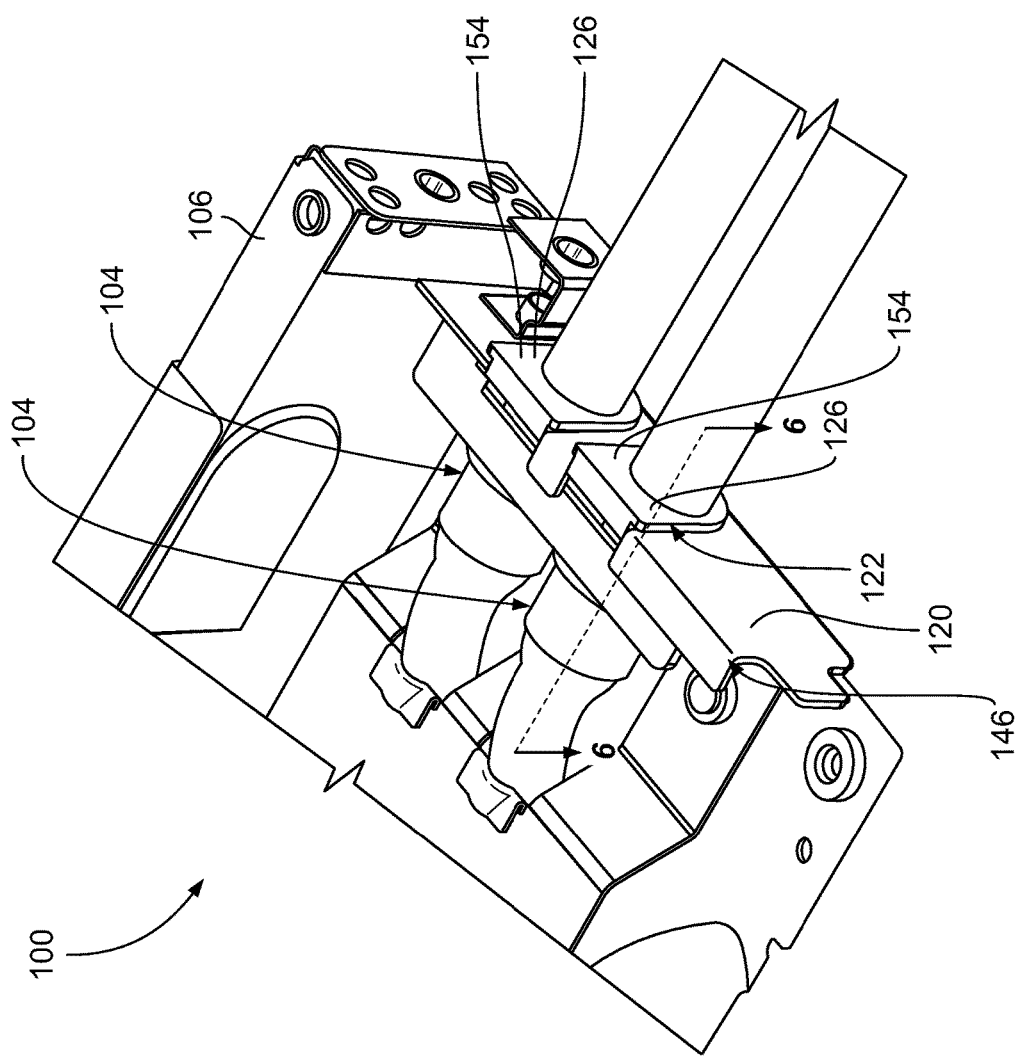
FIG. 5 is an assembled top perspective view of the portion of the communication system shown in FIG. 2.

FIG. 5 is an assembled top perspective view of the portion of the communication system 100 shown in FIG. 2. The cable assemblies 104 are mounted to the cable panel 120 in the loading passages 122. It is recognized that although two cable assemblies 104 are shown in FIG. 5, the communication system 100 may have more or less than two cable assemblies 104 mounted to the device housing 106. The slots 156 (shown in FIG. 3) of the flanges 154 are designed to allow the cable assemblies 104 to be removably mounted to the cable panel 120. For example, each cable assembly 104 may be uncoupled from the cable panel 120 by lifting the grommet 126 upwards beyond the top 146 of the cable panel 120. Therefore, the mounted cable assemblies 104 are able to be removed from the device housing 106 to allow for replacing a damaged cable assembly 104, disassembly of the communication system 100, customization of the communication system 100, or the like.

In an embodiment, the grommets 126 and the cable panel 120 are both composed of electrically conductive materials, and conductive ground paths between the grommets 126 and the cable panel 120 are formed when the cable assemblies 104 are mounted within the loading passages 122. The conductive ground paths may reduce resonances along the cables 124 as described in more detail below with reference to FIG. 6. In an embodiment, the flange 154 of each grommet 126 is U-shaped to complement the shape of the loading passage 122. Each flange 154 may fill all or at least most of the cross-sectional area of the corresponding loading passage 122 to seal the loading passage 122 for EMI containment and/or shielding. For example, the flanges 154 may block EMI transmission across the cable panel 120 through the loading passages 122.

Figure 6:
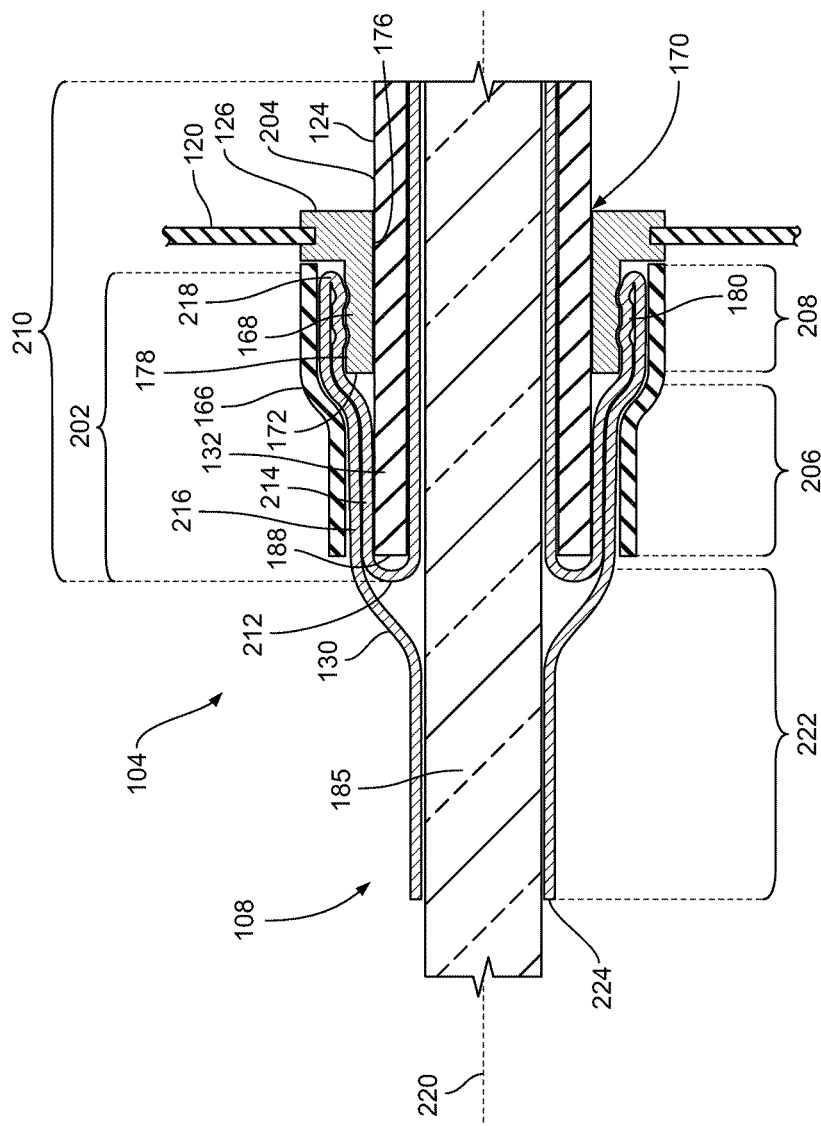
FIG. 6 is a cross-sectional view of the cable assembly mounted to a cable panel of the communication system according to an embodiment.

FIG. 6 is a cross-sectional view of a cable assembly 104 mounted to the cable panel 120 of the communication system 100 according to an embodiment. The cross-sectional view is taken along line 6-6 shown in FIG. 5. The cable 124 extends through the cable channel 170 of the grommet 126. The cable shield 130 and the wire bundle 185 of the cable 124 protrude beyond the end 188 of the outer jacket 132 within the internal cavity 108 of the device housing 106 (shown in FIG. 1). In an exemplary embodiment, the cable shield 130 of the cable 124 is folded around the end 188 of the outer jacket 132 to define an overlap portion 202 of the cable shield 130. The overlap portion 202 extends radially outside of the outer jacket 132 and engages and electrically connects to the grommet 126 surrounding the outer jacket 132. The overlap portion 202 of the cable shield 130 engages the cylindrical sleeve 168. For example, the overlap portion 202 in the illustrated embodiment extends over the interior end 172 of the grommet 126 and engages the outer surface 178 of the cylindrical sleeve 168, surrounding at least a length of the cylindrical sleeve 168. In an alternative embodiment, the overlap portion 202 does not surround the cylindrical sleeve 168, but rather abuts the interior end 172. In another alternative embodiment, the overlap portion 202 does not surround the cylindrical sleeve 168, but rather engages the inner surface 176 of the sleeve 168 between the sleeve 168 and the outer jacket 132. The engagement between the overlap portion 202 of the cable shield 130 and the grommet 126 provides a conductive ground path between the cable shield 130 and the cable panel 120 via the grommet 126. Therefore, electrical resonances along the cable shield 130 may be dissipated along the ground path to the cable panel 120, reducing the harmful effects of such resonance on signal transmission.

The ferrule 166 of the cable assembly 104 surrounds and engages the overlap portion 202 of the cable shield 130 to secure the overlap portion 202 to the grommet 126. For example, the ferrule 166 may directly engage the overlap portion 202 to sandwich the overlap portion 202 between the ferrule 166 and the cylindrical sleeve 168 of the grommet 126. In an embodiment, the ferrule 166 is crimped around the overlap portion 202 via a crimping operation to irremovably secure the overlap portion 202 to the cylindrical sleeve 168. In another embodiment, the ferrule 166 may be composed of a heat-shrink and/or pressure-shrink material that reduces its diameter responsive to an application of heat and/or pressure above a certain threshold to seal around the overlap portion 202.

In the illustrated embodiment, the outer jacket 132 protrudes beyond the interior end 172 of the grommet 126 to the end 188 of the outer jacket 132. The overlap portion 202 includes a first length 206 that engages and extends along a perimeter surface 204 of the outer jacket 132, and a second length 208 that engages and extends along the outer surface 178 of the cylindrical sleeve 168. For example, the second length 208 may engage the one or more annular ridges 180 along the outer surface 178. The ferrule 166 in the illustrated embodiment engages both the first and second lengths 206, 208 of the overlap portion 202. In an alternative embodiment, the interior end 172 of the grommet 126 extends farther into the internal cavity 108 than the end 188 of the outer jacket 132, and the overlap portion 202 engages the outer surface 178 of the sleeve 168 but does not engage the perimeter surface 204 of the outer jacket 132.

The length of the cable shield 130 that is surrounded by the outer jacket 132 is referred to as a covered segment 210 of the cable shield 130. The overlap portion 202 extends from the covered segment 210 at a first fold 212 that extends around the end 188 of the outer jacket 132. The overlap portion 202 overlaps a length of the covered segment 210. The outer jacket 132 is disposed radially between the overlap portion 202 and the covered segment 210. In the illustrated embodiment, the cylindrical sleeve 168 of the grommet 126 is also disposed radially between the overlap portion 202 and the covered segment 210.

In an embodiment, the overlap portion 202 includes a fold back segment 214 and a double back segment 216. The fold back segment 214 extends from the first fold 212 to a second fold 218. The fold back segment 214 engages the outer surface 178 of the cylindrical sleeve 168 and/or the perimeter surface 204 of the outer jacket 132. The fold back segment 214 overlaps a length of the covered segment 210 of the cable shield 130. The second fold 218 aligns with the cylindrical sleeve 168 in the illustrated embodiment. The double back segment 216 extends from the second fold 218 and overlaps the fold back segment 214, optionally directly engaging the fold back segment 214. The double back segment 216 also overlaps the length of the covered segment 210 that is overlapped by the fold back segment 214. The first and second folds 212, 218 extend in opposite directions along a cable axis 220. For example, the cable shield 130 along the first fold 212 curves towards the cable panel 120, and the cable shield 130 along the second fold 218 curves back towards the internal cavity 108. The first and second folds 212, 218 may be made autonomously or manually after trimming back the outer jacket 132 to expose a length of the cable shield 130.

In an embodiment, the cable shield 130 includes an exposed segment 222 that extends from the overlap portion 202 to an end 224 of the cable shield 130 within the internal cavity 108. The exposed segment 222 surrounds the wire bundle 185 of the cable 124 beyond the end 188 of the outer jacket 132 and outside of the cable channel 170 of the grommet 126. The exposed segment 222 provides electrical shielding for the one or more insulated wires 128 (shown in FIG. 4) of the wire bundle 185 within the internal cavity 108.

In the illustrated embodiment, the exposed segment 222 extends from the double back segment 216 of the overlap portion 202. The double back segment 216 therefore extends from the second fold 218 to the exposed segment 222. In an embodiment, the cable shield 130 extends continuously from the covered segment 210 along the fold back segment 214 and the double back segment 216 of the overlap portion 202, and finally to the exposed segment 222.

As shown in FIG. 6, the cable assembly 104 is removably mounted to the cable panel 120 of the device housing 106 (shown in FIG. 1) to allow for simple uncoupling of the cable assembly 104 from the device housing 106. When the cable assembly 104 is mounted to the cable panel 120, a conductive ground path is defined between the cable shield 130 of the cable 124 and the cable panel 120 via the grommet 126, to dissipate electrical resonance along the cable shield 130. Although the cable shield 130 is mechanically and electrically connected to the grommet 126 at the overlap portion 202, the exposed segment 222 of the cable shield 130 extends from the overlap portion 202 into the internal cavity 108 to provide electrical shielding and optionally also mechanical retention of the wires 128 (shown in FIG. 4) in the wire bundle 185 beyond the grommet 126, the outer jacket 132, and the ferrule 166.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112(f), unless and until such claim limitations expressly use the phrase "means for" followed by a statement of function void of further structure.

What is claimed is:

1. A cable assembly comprising:
   a grommet having a cylindrical sleeve defining a cable channel therethrough and a flange extending radially outward from the cylindrical sleeve;
   a cable including one or more insulated wires, a cable shield surrounding the one or more insulated wires, and an outer jacket surrounding the cable shield, the cable extending through the cable channel of the grommet, the cable shield and the one or more insulated wires protruding from an end of the outer jacket, the cable shield having an overlap portion extending around the end of the outer jacket and surrounding and engaging the cylindrical sleeve of the grommet to electrically connect the cable shield to the grommet; and
   a ferrule surrounding and engaging the overlap portion of the cable shield to secure the overlap portion to the cylindrical sleeve of the grommet,
   wherein the overlap portion of the cable shield includes a fold back segment and a double back segment, the fold back segment extending from a first fold around the end of the outer jacket to a second fold, the fold back segment engaging an outer surface of the cylindrical sleeve, the double back segment extending from the second fold and overlapping the fold back segment.

2. The cable assembly of claim 1, wherein the cable shield includes an exposed segment that extends from the overlap portion of the cable shield to an end of the cable shield, the exposed segment surrounding the one or more insulated wires of the cable beyond the end of the outer jacket and outside of the cable channel of the grommet.

3. The cable assembly of claim 2, wherein the exposed segment of the cable shield extends from the double back segment of the overlap portion to the end of the cable shield.

4. The cable assembly of claim 1, wherein the outer jacket surrounds the cable shield along a covered segment of the cable shield, the overlap portion of the cable shield extending from the covered segment at a first fold and overlapping a length of the covered segment, the outer jacket and the cylindrical sleeve of the grommet located radially between the overlap portion and the covered segment.

5. The cable assembly of claim 1, wherein the grommet extends between an exterior end and an interior end, the flange disposed at least proximate to the exterior end, the cylindrical sleeve extending from the flange to the interior end, the overlap portion of the cable shield extending over the interior end of the grommet and engaging the outer surface of the cylindrical sleeve.

6. The cable assembly of claim 1, wherein the flange of the grommet defines a slot along an outer perimeter of the flange, the slot configured to receive an edge of a panel at a loading passage to mount the cable assembly to the panel.

7. The cable assembly of claim 1, wherein the outer jacket of the cable protrudes beyond an interior end of the grommet to the end of the outer jacket, the overlap portion of the cable shield including a first length that engages and extends along a perimeter surface of the outer jacket and a second length that engages and extends along the outer surface of the cylindrical sleeve of the grommet, the ferrule engaging both the first and second lengths of the overlap portion.

8. The cable assembly of claim 1, wherein the ferrule is crimped around the overlap portion of the cable shield to irremovably secure the overlap portion of the cable shield to the cylindrical sleeve of the grommet.

9. The cable assembly of claim 1, wherein the cable shield includes at least one of a conductive braid and a conductive foil.

10. The cable assembly of claim 1, wherein the outer jacket surrounds the cable shield along a covered segment of the cable shield, the fold back segment of the overlap portion overlapping a length of the covered segment, the double back segment overlapping both the fold back segment and the length of the covered segment.

11. A cable assembly comprising:
    a grommet having a cylindrical sleeve defining a cable channel therethrough between an interior end and an exterior end of the grommet;
    a cable including one or more insulated wires, a cable shield surrounding the one or more insulated wires, and an outer jacket surrounding the cable shield, the cable extending through the cable channel of the grommet, the cable shield and the one or more insulated wires protruding from an end of the outer jacket, the cable shield having an overlap portion extending around the end of the outer jacket, the overlap portion extending over the interior end of the grommet and engaging an outer surface of the cylindrical sleeve to electrically connect the cable shield to the grommet, the cable shield further including an exposed segment extending from the overlap portion to an end of the cable shield, the exposed segment surrounding the one or more insulated wires of the cable beyond the end of the outer jacket and beyond the interior end of the grommet; and a ferrule surrounding and engaging the overlap portion of the cable shield to secure the overlap portion to the cylindrical sleeve of the grommet.

12. The cable assembly of claim 11, wherein the grommet further includes a flange extending radially outward from the cylindrical sleeve at least proximate to the exterior end of the grommet, the flange defining a slot along an outer perimeter thereof, the slot configured to receive an edge of a panel at a loading passage to mount the cable assembly to the panel.

13. The cable assembly of claim 11, wherein the outer jacket surrounds the cable shield along a covered segment of the cable shield, the overlap portion of the cable shield extending from the covered segment at a first fold and overlapping a length of the covered segment, the outer jacket and the cylindrical sleeve of the grommet located radially between the overlap portion and the covered segment.

14. The cable assembly of claim 11, wherein the overlap portion of the cable shield includes a fold back segment and a double back segment, the fold back segment extending from a first fold around the end of the outer jacket to a second fold, the fold back segment engaging the outer surface of the cylindrical sleeve, the double back segment extending from the second fold to the exposed segment of the cable shield, the double back segment overlapping the fold back segment.

15. The cable assembly of claim 11, wherein the outer jacket of the cable protrudes beyond the interior end of the grommet to the end of the outer jacket, the overlap portion of the cable shield including a first length that engages and extends along a perimeter surface of the outer jacket and a second length that engages and extends along the outer surface of the cylindrical sleeve of the grommet, the ferrule engaging both the first and second lengths of the overlap portion.

16. A communication system comprising:
a communication device including a device housing having multiple panels defining an internal cavity, the panels including a cable panel defining a loading passage through the panel that is open to the internal cavity; and a cable assembly configured to be removably mounted within the loading passage of the panel, the cable assembly comprising:
a grommet having a cylindrical sleeve defining a cable channel therethrough and a flange extending radially outward from the cylindrical sleeve; and
a cable including one or more insulated wires, a cable shield surrounding the one or more insulated wires, and an outer jacket surrounding the cable shield, the cable extending through the cable channel of the grommet into the internal cavity of the device housing, the cable shield and the one or more insulated wires protruding from an end of the outer jacket, the cable shield having an overlap portion extending around the end of the outer jacket and surrounding and engaging the cylindrical sleeve of the grommet to electrically connect the cable shield to the grommet, the cable shield further including an exposed segment that extends from the overlap portion of the cable shield to an end of the cable shield disposed within the internal cavity of the device housing, the exposed segment surrounding the one or more insulated wires of the cable within the internal cavity beyond the end of the outer jacket and outside of the cable channel of the grommet.

17. The communication system of claim 16, wherein the grommet is composed of an electrically conductive material, the grommet providing a conductive ground path between the overlap portion of the cable shield that engages the cylindrical sleeve and the cable panel of the device housing.

18. The communication system of claim 16, wherein the outer jacket surrounds the cable shield along a covered segment of the cable shield, the overlap portion of the cable shield including a fold back segment extending from a first fold around the end of the outer jacket to a second fold, the fold back segment overlapping a length of the covered segment, the overlap portion further including a double back segment extending from the second fold and overlapping both the fold back segment and the length of the covered segment.

19. The communication system of claim 16, wherein the flange defines a slot along an outer perimeter thereof, the slot receiving an edge of the panel at the loading passage to mount the cable assembly to the panel.

20. The communication system of claim 16, wherein the outer jacket of the cable protrudes beyond the interior end of the grommet to the end of the outer jacket, the overlap portion of the cable shield including a first length that engages and extends along a perimeter surface of the outer jacket and a second length that engages and extends along an outer surface of the cylindrical sleeve of the grommet.

* * * * *